United States Patent [19]
Mayampurath

[11] Patent Number: 6,084,478
[45] Date of Patent: Jul. 4, 2000

[54] TRANSIMPEDANCE AMPLIFIER WITH AUTOMATIC GAIN CONTROL

[75] Inventor: Balagopal Mayampurath, Camarillo, Calif.

[73] Assignee: Vitesse Semiconductor Corp., Camarillo, Calif.

[21] Appl. No.: 09/256,426

[22] Filed: Feb. 23, 1999

Related U.S. Application Data

[60] Provisional application No. 60/097,297, Aug. 20, 1998.

[51] Int. Cl.[7] .............................. H03F 3/08; H03F 1/36; H01J 40/14; H04B 10/06
[52] U.S. Cl. ..................... 330/308; 330/110; 250/214 A; 359/194
[58] Field of Search .................................... 330/110, 308; 250/214 A, 214 AG; 359/189, 194; H03F 1/36, 3/08; H01J 40/14; H04B 10/06

[56] References Cited

U.S. PATENT DOCUMENTS

| | | | |
|---|---|---|---|
| 4,565,974 | 1/1986 | Smoot | 330/308 |
| 5,343,160 | 8/1994 | Taylor | 330/308 |
| 5,548,833 | 8/1996 | Townsend | 330/280 |
| 5,589,881 | 12/1996 | Dunham et al. | 250/214 A |
| 5,864,416 | 1/1999 | Williams | 330/308 |

*Primary Examiner*—Robert Pascal
*Assistant Examiner*—Patricia T. Nguyen
*Attorney, Agent, or Firm*—Christie, Parker & Hale, LLP

[57] ABSTRACT

A transimpedance amplifier in an optical communication system is provided with automatic gain control (AGC) for increasing the input operating range while maintaining high stability. A photodetector is used to convert an optical signal into a differential current for the transimpedance amplifier. An AGC circuit has a gain control device connected across the differential input of the transimpedance amplifier. The gain control device has an impedance that varies as a function of a voltage at the differential output of the transimpedance. Preferably, the gain control device is a FET having a drain coupled to one of the differential inputs, a source coupled to the other differential input, and a gate for receiving an AGC voltage, the AGC voltage being a function of the voltage at the differential output.

11 Claims, 4 Drawing Sheets

TRANSIMPEDANCE AMPLIFIER WITH AUTOMATIC GAIN CONTROL

This application claims benefit of Provisional Application Ser. No. 60/097,297, filed Aug. 20, 1998.

BACKGROUND OF THE INVENTION

The present invention relates generally to transimpedance amplifiers, and more particularly, to differential transimpedance amplifiers with automatic gain control.

Receivers in optical communication systems use transimpedance amplifiers to convert current outputs of photodetectors to voltages. In these applications, average detected power can vary by two or three orders of magnitude depending upon the particular optical fiber link used to transmit the signal. Accordingly, the transimpedance amplifier must be designed to operate over a wide range of input currents. This is sometimes accomplished by automatically controlling the gain of the transimpedance amplifier.

A conventional single-ended transimpedance amplifier with automatic gain control (AGC) is shown in FIG. 1. A photodetector 10 is used to convert an optical input into a current. For analytical purposes, the photodetector is modeled by an ideal current source 12 in parallel with a capacitor 14. The photodetector 10 is connected to the input of an inverting amplifier 16 with an open-loop gain of (−A). A feedback circuit comprising a feedback resistor 18 connected in parallel with a feedback field effect transistor 20 (FET) is coupled between the input and output of the amplifier 16. The output of the amplifier 16 is connected to an AGC circuit 22. An AGC buffer 21 in conjunction with a shunt capacitor 24 produces an AGC voltage at the output of the AGC buffer. The AGC voltage is the average voltage of the amplifier 16 output. The AGC voltage is applied to the gate of the feedback FET 20.

In operation, a voltage is developed at the output of the amplifier 16 due to the flow of current in the feedback circuit. The average output voltage of the amplifier 16 is applied to the gate of the feedback FET 20 via the AGC buffer 21 in conjunction with the shunt capacitor 24. For low optical input power the average output voltage of the amplifier 16 is low, the feedback FET 20 is off, and the effective transimpedance of the amplifier 16 is equal to the value of the feedback resistor 18. As the optical input power increases, however, the average output voltage of the amplifier 16 increases, causing the feedback FET 18 to turn on. This reduces the effective impedance of the feedback resistor, and thus the transimpedance of the amplifier 16, and thereby maintains the amplifier 16 in the linear region. Thus, the AGC circuit 22 ensures that the amplifier 16 is not overloaded. In the absence of the AGC circuit 22, large voltages developed across the feedback resistor 18 may cause severe distortion and jitter in the output of the amplifier 16.

A common problem encountered with such a conventional transimpedance amplifier employing AGC is decreased stability. In the closed-loop system described in FIG. 1, for example, the frequency of the dominant pole (P1) is set by the feedback resistor 18 ($R_f$), the total input capacitance ($C_{in}$), and the open-loop gain of the transimpedance amplifier 16 (−A) according to the formula $P1=-A/2(R_f C_{in})$ radians/sec., where $C_{in}$ is the sum of the photodetector capacitance 14, the input capacitance of the transimpedance amplifier 16 and any parasitic capacitances. As long as P1 is sufficiently far from the pole of the transimpedance amplifier 32 as to have a phase margin of 45°, stability is maintained. When the feedback FET 40 turns on, however, $R_f$ is effectively reduced, thereby increasing P1. As P1 moves towards the frequency of the transimpedance amplifier pole, which is generally at a higher frequency, the phase margin is reduced. To maintain good phase margin, the open-loop gain (−A) of the transimpedance amplifier 32 must be reduced. The reduction in open-loop gain requires additional circuitry not shown. Accordingly, there is a current need for a transimpedance amplifier with AGC that maintains stability with minimal additional circuitry.

SUMMARY OF THE INVENTION

An embodiment of the present invention is directed to an amplifier with AGC which satisfies this need. In one embodiment, a differential amplifier with a differential input and a differential output is equipped with an AGC circuit. The AGC circuit has a gain control device connected across the differential input. The gain control device has an impedance that varies as a function of the differential output of the differential amplifier. Preferably, the differential amplifier is a transimpedance amplifier, and the gain control device is a FET having a drain coupled to one of the differential inputs, a source coupled to the other differential input, and a gate for receiving an AGC voltage, the AGC voltage being a function of the differential output.

The transimpedance amplifier with AGC is incorporated in an optical communication system in another embodiment of the present invention. In this embodiment, a photodetector for converting an optical signal into a differential current is positioned at the input of the circuit. A differential transimpedance amplifier converts the differential current to a differential voltage. The differential transimpedance amplifier has a differential input for receiving the differential current from the photodetector and a differential output for generating the differential voltage. The differential transimpedance amplifier is equipped with AGC which includes a gain control device connected across the differential input. The gain control device has an impedance that varies as a function of the differential voltage. In one embodiment, the device is a FET having a drain coupled to one of the differential inputs, a source coupled to the other differential input, and a gate for receiving an AGC voltage. The AGC voltage being a function of the differential voltage.

An attractive feature of an embodiment of the present invention is the ability to maintain stable operation at high input currents without the need for additional circuitry to reduce the open-loop gain of the amplifier.

It is understood that other embodiments of the present invention will become readily apparent to those skilled in the art from the following detailed description, wherein it is shown and described only embodiments of the invention by way of illustration of the best modes contemplated for carrying cut the invention. As will be realized, the invention is capable of other and different embodiments and its several details are capable of modification in various other respects, all without departing from the spirit and scope of the present invention. Accordingly, the drawings and detailed description to be regarded as illustrative in nature and not as restrictive.

DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

Figure 1:
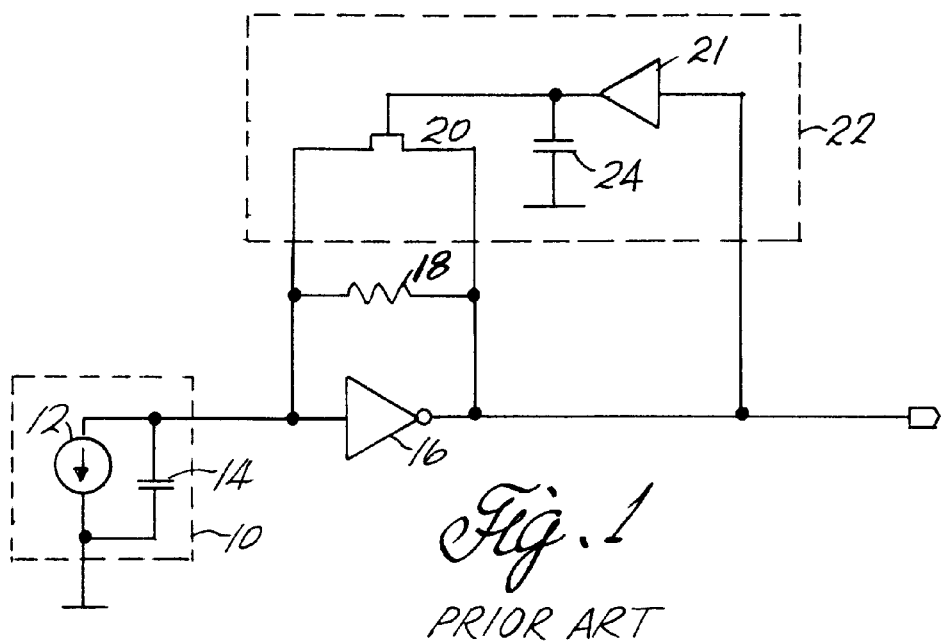
FIG. 1 is an electrical schematic block diagram of a single-ended transimpedance amplifier with conventional AGC.
Figure 2:
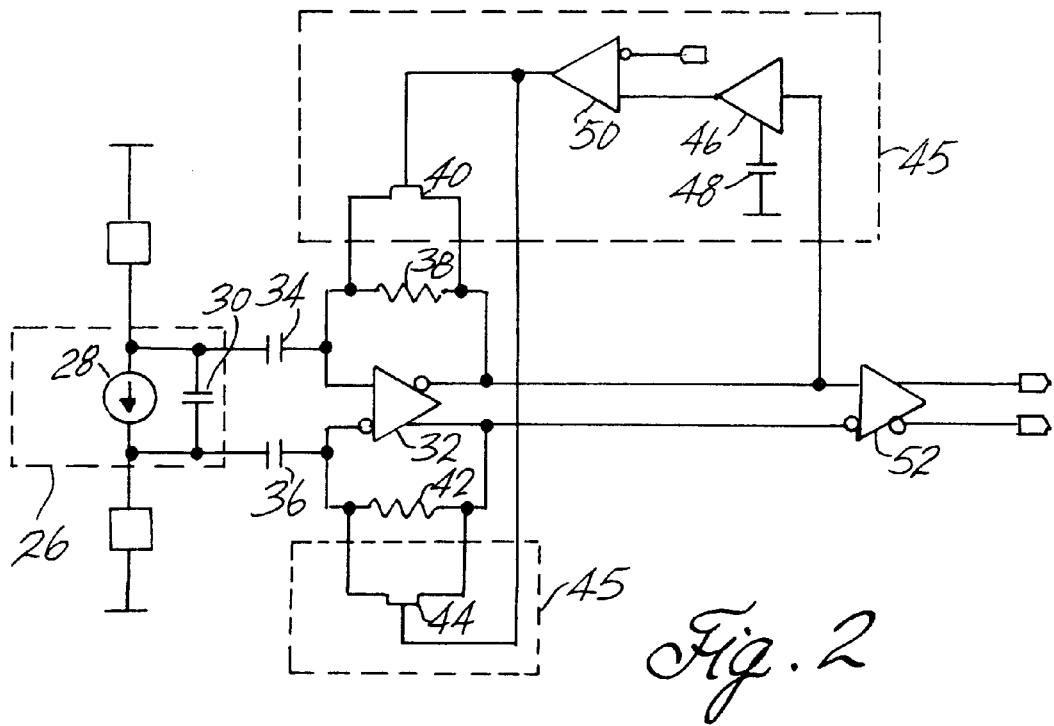
FIG. 2 is an electrical schematic block diagram of a differential transimpedance amplifier with AGC.

A schematic of differential transimpedance amplifier is shown in FIG. 2. In the differential transimpedance amplifier of FIG. 2 a differential photodetector 26 is employed to convert an optical input into a differential current signal. As with the single-ended configuration, the photodetector 26 is similarly modeled by an ideal current source 28 in parallel with a capacitor 30. The differential current signal from the photodetector 26 is applied to the input of a differential transimpedance amplifier 32 through DC blocking capacitors 34, 36. The DC blocking capacitors 34, 36 allow a DC bias to be maintained across the photodetector 26. The transimpedance amplifier 32 includes two feedback circuits, one connected between the non-inverting input and inverting output of the transimpedance amplifier 32, and another connected between the inverting input and non-inverting output of the transimpedance amplifier 32. Each feedback circuit comprises a feedback resistor 38, 42 in parallel with a feedback FET 4C, 44, respectively.

The inverting output of the transimpedance amplifier is fed to an AGC circuit 45. The AGC circuit 45 outputs an AGC voltage equal to the rectified peak output voltage of the transimpedance amplifier 32. The inverting output of the transimpedance amplifier 32 is connected to a peak detector 46. The peak detector 46 is a rectifier which produces a non-zero average voltage despite current flow in both directions in the feedback circuit of the transimpedance amplifier 32. The peak detector 46 in conjunction with a capacitor 48 is used to generate the smoothed peak voltage of the transimpedance amplifier 32. The time constant is set by the capacitor 48.

The output of the peak detector 46 is connected to an AGC amplifier 50. The AGC amplifier 50 provides high gain for improved dynamic range. A reference voltage $V_{th}$ is used to set the threshold voltage of the AGC amplifier 50. The AGC amplifier 50 is designed with higher gain at the threshold voltage crossing point.

A buffer 52 is connected to the differential output of the transimpedance amplifier 32 to reduce the asymmetric voltage about the common-mode voltage caused by the different transimpedance of the feedback FETs 40, 44 for currents flowing in different directions. The asymmetric voltage is caused by the different gate-to-source voltages of each feedback FET 40, 44 for currents of the same magnitude flowing in opposite directions.

Figure 3:
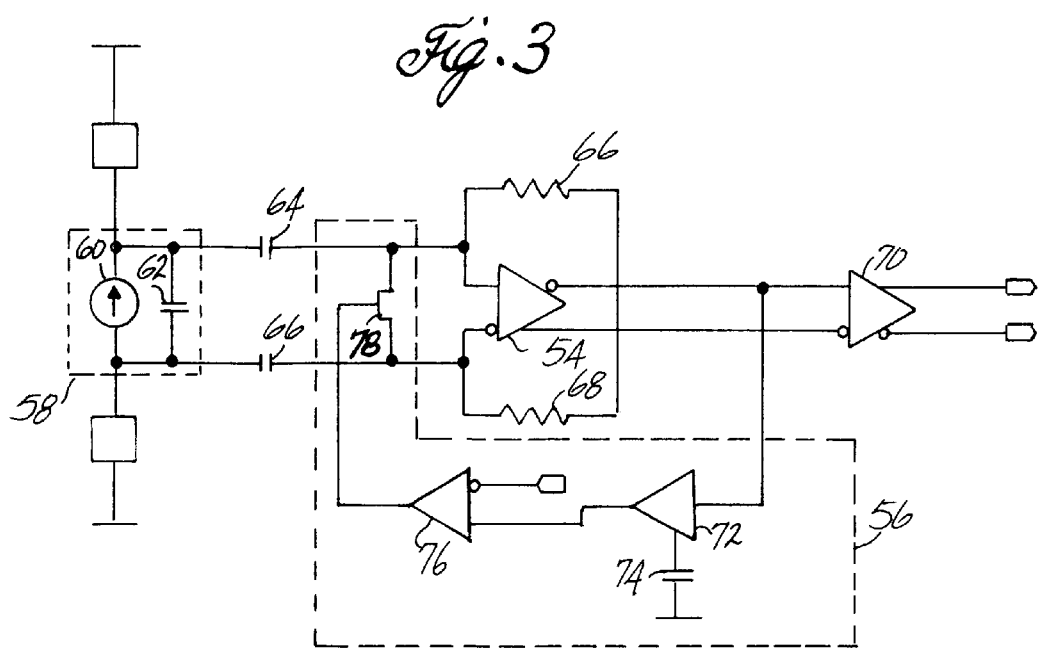
FIG. 3 is an electrical schematic block diagram of a differential transimpedance amplifier with AGC in accordance with a preferred embodiment of the present invention.

According to another embodiment of the present invention, a wide operating range for input current is achieved with high stability for a differential transimpedance amplifier 54 with the AGC circuit 56 shown in FIG. 3. A photodetector 58 converts an optical input into a differential current signal. For analytical purposes, the photodetector 58 is modeled by an ideal current source 60 in parallel with a capacitor 62. DC bias across the photodetector 58 is maintained by connecting the differential output of the photodetector 58 to the differential input of the transimpedance amplifier 54 through DC blocking capacitors 64, 66. The transimpedance amplifier 54 includes two feedback resistors 66, 68, one connected between the non-inverting input and the inverting output of the transimpedance amplifier 54, and the other connected between the inverting input and the non-inverting output of the transimpedance amplifier 54. The differential output of the transimpedance amplifier 54 is connected to a buffer 70. The buffer 70 provides additional voltage gain, and any required output current necessary to drive the output sufficiently to interface with an external circuit.

The output of the transimpedance amplifier 54 is fed to the AGC circuit 56. In the described embodiment, a smoothed peak voltage of the transimpedance amplifier 54 is generated by connecting the inverting output of the transimpedance amplifier 54 to a peak detector 72. The inverting output of the transimpedance amplifier 54, which provides a signal which is a component of the differential output, provides a convenient way for detecting the peak voltage. Those skilled in the art, however, will readily appreciate that the non-inverting output, or the differential output, could also be used. The peak detector 72, in conjunction with a capacitor 74, is used to detect the smoothed peak voltage of the transimpedance amplifier 54. The switching time of the AGC circuit 56 is set by the charging and discharging time-constants of the peak detector 72 and capacitor 74. The output of the peak detector 72 is connected to an AGC amplifier 76. The AGC amplifier 76 provides high gain for improved dynamic range. A reference voltage $V_{th}$ is used to set the threshold voltage of the AGC amplifier 76. The AGC amplifier 76 is designed with higher gain around the threshold voltage crossing point.

The output of the AGC amplifier 76 is applied to a gain control device 78 connected across the differential input of the transimpedance amplifier 54. In one embodiment, the gain control device 78 is a FET with a gate connected to the output of the AGC amplifier 76, a drain connected to the non-inverting input of the transimpedance amplifier 54, and a source connected to the inverting input of the transimpedance amplifier 54. The AGC amplifier 76 should be maintained in the linear region for proper AGC operation. The finite open-loop gain of transimpedance amplifier 54 ensures that FET 78 has non-zero drain-to-source voltage across it, allowing it to turn on and provide a shunt path for current from the photodetector 58.

As the output amplitude of the transimpedance amplifier 54 increases, the gate drive to the FET 78 also increases. With the FET 78 being operated in the active region, increased gate drive results in a larger current shunt through the FET 78 thereby reducing the current flowing through the feedback resistors 66, 68 of the transimpedance amplifier 54. The reduced current flow in the feedback resistors 66, 68, in turn, causes a reduction in the voltage at the output of the transimpedance amplifier 54. The AGC circuit 56 thus prevents overloading of the transimpedance amplifier 54, ensuring that the output voltage is neither distorted nor has jitter.

Figure 4:
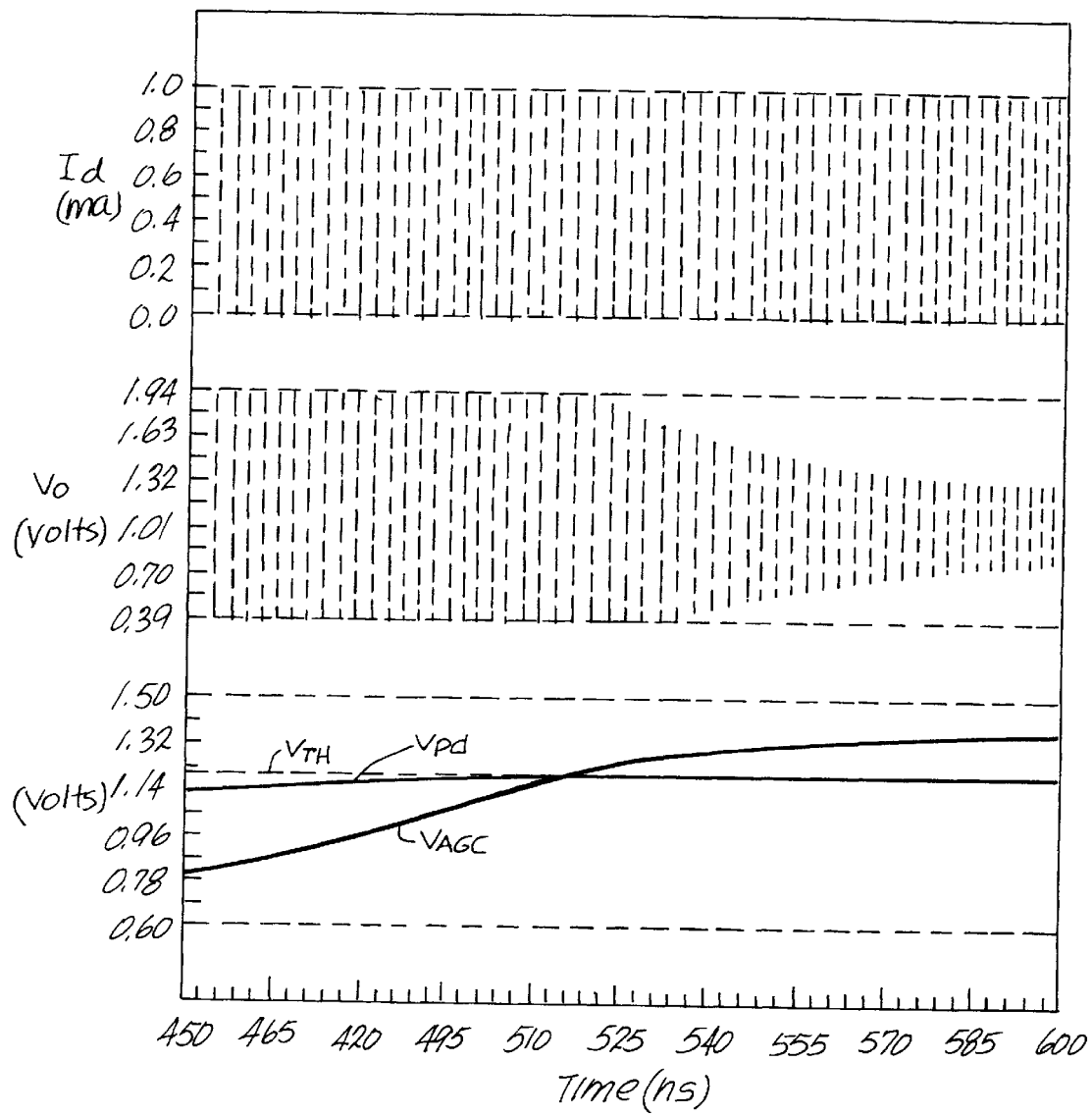
FIG. 4 is a timing diagram showing the operation of the AGC in accordance with a preferred embodiment of the present invention.

Simulated results of the described embodiment are shown in FIG. 4. The simulated results are based on a differential transimpedance amplifier with AGC using a GaAs MESFET process. The AGC circuit topology is technology independent, and therefore, can also be used with silicon processes as well. The output of the photodetector is a clock with a frequency of 625 MHz, with a minimum current at 0 mA and a maximum current at 1 mA. The threshold voltage ($V_{th}$) of the AGC amplifier is set at approximately 1.2 volts. As seen from FIG. 4, as the output voltage ($V_{pd}$) of the peak detector increases, the output voltage ($V_{agc}$) of the AGC amplifier increases accordingly. Once the output voltage ($V_{pd}$) of the peak detector exceeds the threshold voltage ($V_{th}$) of the AGC amplifier, the AGC turns on the feedback FET connected across the differential input of the transimpedance amplifier. As a result, a portion of the current ($I_d$) from the photodetector is shunted through the feedback FET, which, in turn, reduces the current flow through the feedback resistors thereby reducing the output voltage ($V_o$) of the transimpedance amplifier.

The improvement in stability of the above described embodiment can best be understood by observing the relation between the poles in the circuit. As explained above, the dominant pole of the differential transimpedance amplifier with feedback is given by $P1 = -A/2(R_f C_{in})$. When the AGC begins to turn on, the FET begins to reduce the effective transimpedance of the amplifier seen by the photodetector. This has the effect of sliding the dominant pole to a higher frequency toward the pole of the transimpedance amplifier. If the open loop gain of the transimpedance amplifier does not reduce accordingly, the phase-margin around the loop will decrease, until the circuit begins to oscillate. The methods for analyzing the open-loop gain of the transimpedance amplifier are well known, and therefore, will not be described. However, in the described embodiment, the FET also reduces the open loop gain of the transimpedance amplifier so that the circuit continues to remain stable.

Figure 5:
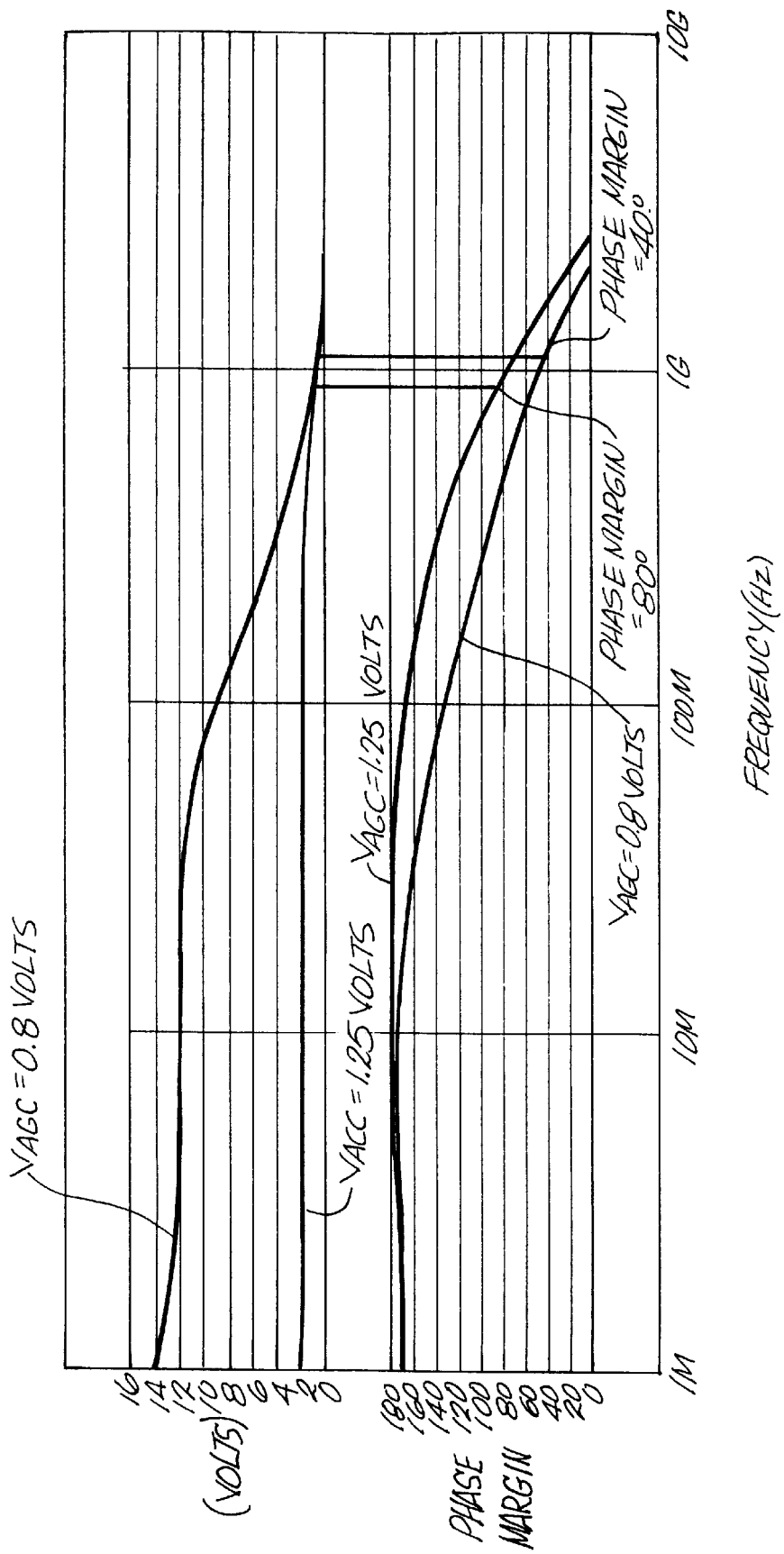
FIG. 5 are phase margin plots of a simulated circuit in accordance with a preferred embodiment of the present invention.

The stability of the circuit can be shown graphically with gain and phase plots for two different AGC voltages. The simulated results shown in FIG. 5 are for a specific design using a MESFET process, and is intended to be an illustration only. The phase margin and bandwidth for other implementations will depend on the design and the process used.

Turning to FIG. 5, in the first case the AGC voltage $V_{AGC}$ is 0.8 volts and the FET is off. Since no oscillations are possible if the magnitude of the loop gain is less than unity when the phase angle is 180°, the simulated circuit remains stable because the phase margin at unity is 40°. When $V_{AGC}$ is set at 1.25 volts, a larger bandwidth results from the movement of the dominant pole. However, the open loop gain of the transimpedance amplifier has reduced significantly, so that the phase margin is very high. In the second case, the phase margin at unity is 80°, resulting in an improvement in stability. The phase margin and bandwidth for other implementations will depend on the design and the process used.

It is apparent from the foregoing that the described embodiments of the present invention satisfy an immediate need for a transimpedance amplifier with AGC having both a wide operating range with high stability without the need for additional circuitry to reduce the open loop gain. This transimpedance amplifier with AGC may be embodied in other specific forms and can be used with a variety of electronic equipment without departing from the spirit or essential attributes of the present invention. It is therefore desired that the described embodiments be considered in all respects as illustrative and not restrictive, reference being made to the appended claims and the equivalents thereof rather than the foregoing description to indicate the scope of the invention.

What is claimed is:

1. A differential amplifier with automatic gain control (AGC), comprising:
   a differential amplifier having a differential input and a differential output; and
   an AGC circuit comprising a gain control device connected across the differential input, said gain control device having an impedance that varies as a function of a signal on at least one of the differential outputs,
   wherein said gain control device comprises a field effect transistor (FET) having a drain coupled to one of the differential inputs, a source coupled to the other differential input, and a gate responsive to an AGC voltage, said AGC voltage being a function of the signal on said at least one of the differential outputs.

2. The differential amplifier of claim 1 wherein said differential amplifier comprises a transimpedance differential amplifier.

3. The differential amplifier of claim 1 further comprising a peak detector connected to said at least one of the differential outputs for a smoothed peak value of the signal, said gate of the FET being responsive to the smoothed peak value of the signal.

4. The differential amplifier of claim 3 further comprising an AGC amplifier for amplifying the smoothed peak value of the signal to provide an amplified smoothed peak signal, said gate of the FET being responsive to said amplified smoothed peak signal.

5. An optical communication link, comprising:
   a photodetector for converting an optical signal into a differential current;
   a differential transimpedance amplifier for converting the differential current to a differential voltage, said transimpedance amplifier having a differential input for receiving the differential current; and
   an automatic gain control (AGC) circuit comprising a gain control device connected across the differential input of the transimpedance amplifier, said gain control device having an impedance that varies as a function of the differential voltage.

6. The optical communication link of claim 5 wherein said gain control device comprises a field effect transistor having a drain coupled to one of the differential inputs, a source coupled to the other differential input, and a gate for receiving an AGC voltage, said AGC voltage being a function of a component of the differential voltage.

7. The optical communication link of claim 6 further comprising a peak detector for determining a maximum amplitude of the component of the differential voltage, said gate of the field effect transistor being responsive to the maximum amplitude of the component of the differential voltage.

8. The optical communication link of claim 7 further comprising an AGC amplifier for amplifying the maximum amplitude of the component of the differential voltage, said gate of the field effect transistor being responsive to said amplified maximum amplitude of the component of the differential voltage.

9. The optical communication link of claim 5 wherein said AGC circuit comprises an AGC voltage, and the impedance of the gain control device varies as a function of the AGC voltage, said AGC voltage being substantially equal to a component of the differential voltage.

10. The optical communication link of claim 9 wherein said impedance of the gain control device varies inversely with the AGC voltage.

11. A differential transimpedance amplifier with automatic gain control (AGC), comprising:
   a differential transimpedance amplifier having a differential input, a differential output, a first feedback resistor connected between one of the differential inputs and one of the differential outputs, and a second feedback resistor connected between the other differential input and the other differential output; and an AGC circuit comprising a rectifier having an input connected to said one of the differential outputs, and an output, an AGC amplifier having a first input connected to the output of the rectifier, a second input connected to a reference point, and an output, and a field effect transistor having a drain connected to said one of the differential inputs, a source connected to the other differential input, and a gate connected to the output of the AGC amplifier.

* * * * *